(12) United States Patent
Martin et al.

(10) Patent No.: US 6,280,644 B1
(45) Date of Patent: Aug. 28, 2001

(54) METHOD OF PLANARIZING A SURFACE ON AN INTEGRATED CIRCUIT

(75) Inventors: Edward P. Martin; Morgan J. Thoma; Daniel J. Vitkavage, all of Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/298,792

(22) Filed: Apr. 23, 1999

Related U.S. Application Data
(60) Provisional application No. 60/088,157, filed on Jun. 5, 1998.

(51) Int. Cl.[7] ...................................................... B44C 1/22
(52) U.S. Cl. .............................. 216/38; 216/16; 438/622; 438/645; 438/697
(58) Field of Search ........................ 216/38, 16; 438/622, 438/645, 697

(56) References Cited

U.S. PATENT DOCUMENTS

| | | | |
|---|---|---|---|
| 4,515,652 | * 5/1985 | Gimpelson et al. | 156/643 |
| 4,655,874 | * 4/1987 | Marks | 156/643 |
| 5,885,900 | * 3/1999 | Schwartz | 438/697 |
| 5,942,449 | * 8/1999 | Meikle | 438/747 |

* cited by examiner

*Primary Examiner*—Randy Gulakowski
*Assistant Examiner*—M. Kornakov

(57) ABSTRACT

The invention provides a method of planarizing an irregular surface of a semiconductor wafer. In one embodiment, the method comprises applying a photoresist material over recessed areas and protruding areas of the irregular surface, etching the photoresist, etching partially into protruding areas of the irregular surface to remove a portion of the irregular surface, and polishing the irregular surface to a substantially planar surface. In some embodiments method may include chemically and mechanically polishing the irregular surface.

12 Claims, 4 Drawing Sheets

BEFORE PLANARIZATION

AFTER MTR+CMP PLANARIZATION

CHEMICAL-MECHANICAL POLISHING
BEFORE CMP

CHEMICAL-MECHANICAL POLISHING
AFTER CMP

BLOCK MTR + CMP
DIELECTRIC DEPOSITION

BLOCK MTR + CMP
AFTER MTR PHOTOLITHOGRAPHY

BLOCK MTR + CMP
AFTER BLOCK MTR ETCH

BLOCK MTR + CMP
AFTER CMP

BLOCK MTR + PLUG CMP
DIELECTRIC DEPOSITION

BLOCK MTR + PLUG CMP
AFTER MTR PHOTOLITHOGRAPHY

BLOCK MTR + PLUG CMP
AFTER BLOCK MTR ETCH

BLOCK MTR + PLUG CMP
AFTER VIA PHOTO/ETCH + PLUG DEPOSITION

BLOCK MTR + PLUG CMP
AFTER PLUG CMP + OXIDE CMP

HORN MTR + CMP
DIELECTRIC DEPOSITION

HORN MTR + CMP
AFTER HORN MTR PHOTOLITHOGRAPHY

HORN MTR + CMP
AFTER HORN MTR ETCH + STRIP

HORN MTR + CMP
AFTER CMP

METHOD OF PLANARIZING A SURFACE ON AN INTEGRATED CIRCUIT

CROSS-REFERENCE TO RELATED APPLICATION

This application claims the benefit of U.S. Provisional Application Serial No. 60/088,157, filed on Jun. 5, 1998, and entitled "METHOD OF PLANARIZING A SURFACE OF AN INTEGRATED CIRCUIT," commonly assigned with the present invention and incorporated herein by reference.

TECHNICAL FIELD OF THE INVENTION

The present invention is directed, in general, to a method of planarizing a surface on an semiconductor wafer, and, more specifically, to a method of using a combination of photolithography and reactive ion etching in conjunction with a chemical/mechanical polishing process to substantially planarize an irregular surface of an integrated circuit.

BACKGROUND OF THE INVENTION

Throughout the evolution of integrated circuits, the aim of device scaling has been to increase circuit performance and to increase the functional complexity of the circuits. At the outset, scaling down of active device sizes was a very effective means of achieving these goals. Commonly, the functional complexity of the circuits in shrinking dimensions are limited by the characteristics of the metallic conductors (commonly referred to as interconnects) that provide the electrical connections between the underlying elements. The key characteristics considered when employing such interconnects are the minimum width and separation of the conductor features as well as the total number of interconnect levels that are required.

In order, to satisfactorily use interconnects with the required small dimensions, the surface of the integrated circuit must maintain a required degree of planarization throughout the fabrication process. Such planarization is required because of the demands of high resolution photolithography processes used during fabrication. While employing the photolithographic process, the printing of higher resolution features comes at the expense of decreased focus depths. The surface must maintain a high enough degree of planarization so that features in every area of a chip may be printed in focus. Failure to maintain this degree of planarity will result in device yield loss due to irregularities in the interconnect layers.

The non-planarity of the top surface of a integrated circuit is determined by the cumulative non-planarity of all the underlying levels. Therefore, as the number of underlying interconnect levels is increased, the degree of planarization of each level must be increased in order to maintain the required planarity at the uppermost level. For a more thorough discussion of planarization and the effects of non-planarity on photolithography, see S. Wolf's, Silicon Processing for the VLSI Era, Vol. 2, which is incorporated herein by reference.

The term planarization is generally well known to those skilled in the art. Those skilled in the art are also familiar with the fact that there are varying degrees of planarization. A planarized surface, as used herein, shall mean a substantially planar surface, that is, it is a surface where typically the difference between the highest and lowest points has been reduced to less than 15% of the initial value after a planarizing process, rather than absolutely planar. Such planarization may be implemented in either the conductor or the dielectric layers. Without such planarization, the microscopic recessed areas that result on the wafer surface from the stacking of device features can lead to topography conditions that would eventually reduce the yield of circuits to unacceptably small values.

Distinction is also often made between a locally planarized surface and a globally planarized surface. A locally planarized surface is characterized by the absence of large recesses or protrusions in the surface. The surface is flat over short distances but not necessarily over long distances. A locally planarized surface can have long gentle slopes such that an appreciable height difference can occur over the several millimeter length of an integrated circuit. In contrast, a globally planarized surface is flat over dimensions greater than that of single large integrated circuits.

Currently, the most commonly used planarization technique used for fabricating integrated circuit is chemical mechanical polishing (CMP). CMP removes material from the wafer surface through a combination of chemical etching and mechanical abrasion of the dielectric layer. CMP at a dielectric level preferentially removes the high portions of the uppermost dielectric layer, which occur in areas directly above underlying interconnect topography.

Many problems arise, however, when a CMP process is employed for wafer planarization. Significant deviation from global planarity often results due to pattern density effects. The dielectric removal rate during CMP is lower for regions with a high density of underlying interconnect structures because a large fraction of the wafer surface contacts the polishing pad in these regions. Consequently, the height of the dielectric layer will vary dramatically across the chip depending on the underlying metal pattern density.

Additionally, CMP processes often result in severe wafer to wafer variations in dielectric thickness due to systematic changes in CMP polish rate with number of wafers polished. Consequently, the CMP process must be closely monitored throughout the production and customized each time a different device is produced. This results in high production costs and lost time as the fabrication equipment must be re-calibrated with each successive lot of wafers.

Employing a CMP process also commonly results in significant lot to lot variability of the remaining oxide. Different types of integrated circuit devices will possess different metal pattern densities. Both the absolute metal pattern density and its distribution across the chip area can vary significantly between devices. These effects require the CMP process to be closely monitored throughout the production and customized each time a different device is produced. This monitoring results in high production costs and lost time as the fabrication equipment must be re-calibrated with each successive lot of wafers.

Accordingly, what is needed in the art is a method for planarizing an irregular surface of a semiconductor wafer that avoids the problems associated with prior art methods.

SUMMARY OF THE INVENTION

To address the above-discussed deficiencies of the prior art, the present invention provides a method of planarizing an irregular surface of a semiconductor wafer. In one embodiment, the method comprises applying a photoresist material, employing photolithography to selectively remove portions of the photoresist from protruding areas of the irregular surface, etching the photoresist, etching partially into the protruding areas of the irregular surface to remove a portion of the irregular surface, and polishing the irregular surface to a substantially planar surface, which in some embodiments, may include chemically and mechanically polishing the irregular surface.

In another embodiment, the method further comprises applying an additional photoresist in the recessed areas prior to applying the photoresist over the irregular surface. In one aspect of this particular embodiment, applying an additional photoresist is a block photoresist process.

In one advantageous embodiment, applying a photoresist material over recessed areas and protruding areas of the irregular surface, applying an additional photoresist in the recessed areas prior to applying the photoresist over the irregular surface, etching the photoresist, and etching partially into protruding areas of the irregular surface to remove a portion of the irregular surface is a metal topography reduction etching process.

In one embodiment of the present invention, etching the photoresist includes leaving a portion of the photoresist in the recessed areas. In such embodiments, applying a photoresist material over recessed areas and protruding areas of the irregular surface, etching the photoresist, leaving a portion of the photoresist in the recessed areas, and etching partially into protruding areas of the irregular surface to remove a portion of the irregular surface method is a horn metal topography reduction etching process.

In yet another embodiment, applying includes applying the photoresist over a dielectric material having an irregular surface, and in advantageous applications, the dielectric is deposited over active devices of an integrated circuit. In many applications, the dielectric material may be composed of conventional materials such as silicon dioxide.

In yet another aspect, the present invention includes forming openings in the irregular surface and forming interconnect material within the opening prior to polishing.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1A:
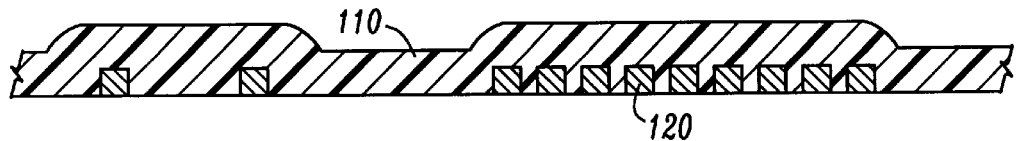
FIGS. 1A–1B illustrate cross-sectional views of a semiconductor device prior to and after application of the present invention.
Figure 1B:
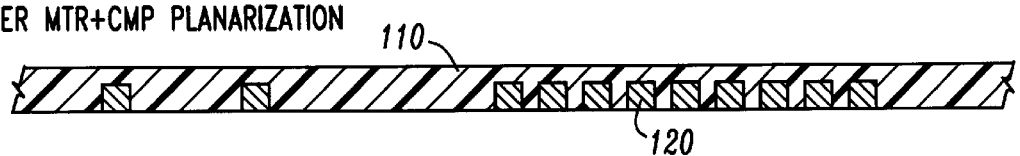

Referring initially to FIGS. 1A–1B, illustrated are cross-sectional views of a semiconductor device prior to and after application of the present invention. FIG. 1A shows the semiconductor device prior to application of any planarization process. As can be noted, the surface of a dielectric layer 110 reflects a plurality of underlying conventional interconnect structures (one of which is designated as 120). Alternatively, FIG. 1B reveals the results of the use of the present invention, a metal topography reduction (MTR) process followed by a CMP process. The surface of the dielectric layer 110 is relatively planar without effects from the underlying interconnect structure topography 120. Metal (M) is commonly used as the material for the interconnect structures 120.

Metal topography reduction (MTR) is a process that reduces variations on a dielectric surface caused by underlying topologies. Generally, this process includes applying photoresist upon a dielectric layer that exhibits effects of an underlying interconnect structure topography. The applied photoresist is then treated with a light source in a photolithic process. Depending on manufacturing requirements, the photoresist is either underexposed or fully exposed and under developed. The photoresist and dielectric layer are then etched to produce a surface that exhibits relatively few variations caused by the underlying topographies.

The present invention uniquely utilizes two different types of MTR processes, a block MTR and a horn MTR. Block MTR involves applying a photoresist and selectively removing portions of the photoresist via photolithography from protruding areas of the dielectric surface. The remaining photoresist will remain in recesses in the dielectric surface and should have a thickness which is comparable to the height of the protruding areas of the dielectric surface. Next an additional photoresist is applied over the remaining portions of the photoresist and the dielectric layer. Afterwards, the photoresist layers and the underlying dielectric layer is etched until all of the applied photoresist is removed.

During the horn MTR, a photoresist is applied and exposed via photolithography as previously stated, and then etched. During the etching, at least a portion of the photoresist is removed along with a portion of the dielectric layer. The resulting surface contains small protrusions (called "horns") that may be later removed.

Figure 2A:
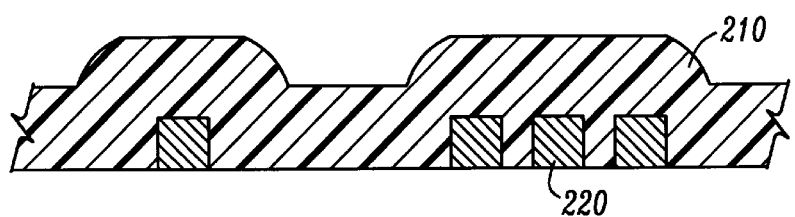
FIGS. 2A–2B illustrate cross-sectional views of a prior art planarization process.
Figure 2B:
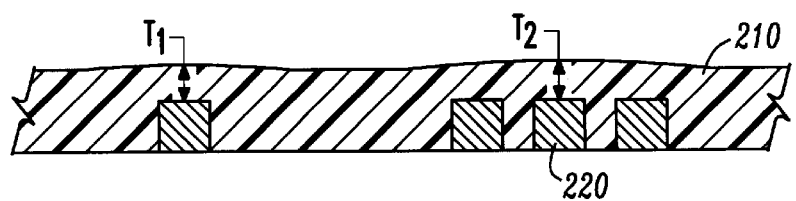

Turning now to FIGS. 2A–2B, illustrated are cross-sectional views of a prior art planarization process. FIG. 2A shows a plurality of conventional interconnect structures (one of which is designated as 220), over which a layer of dielectric material 210 has been deposited. The surface of the dielectric layer 210 dramatically reflects the topography of the underlying interconnect structures 220. FIG. 2B depicts the results after a CMP process is employed. While the surface of the dielectric layer 210 is locally planar, the pattern density variation in the underlying interconnect structures 220 creates an unacceptable amount of non-planarity in the dielectric surface 210 as indicated by the variation in the dielectric layer height in different areas after the CMP process. As is shown, where the density of underlying interconnect structures 220 is low, the variation in the dielectric thickness has a first value T1 and where the density is high, the variation in dielectric thickness has a second value T2, such that the first value T1 is less than the second value T2. As the density of interconnect structures increases, so does the variation in the overlying thickness.

Figure 3A:
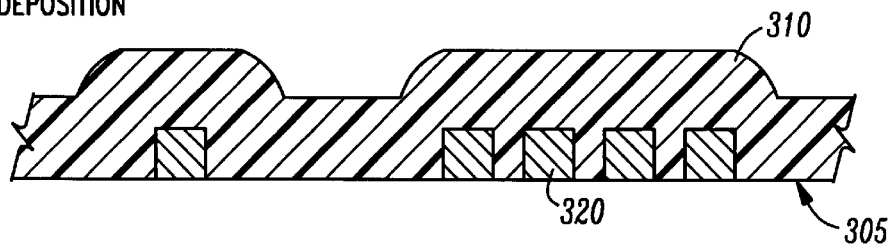
FIGS. 3A–3D illustrate cross-sectional views of procedural steps of an embodiment of the present invention, a Block MTR process followed by a CMP process.
Figure 3B:
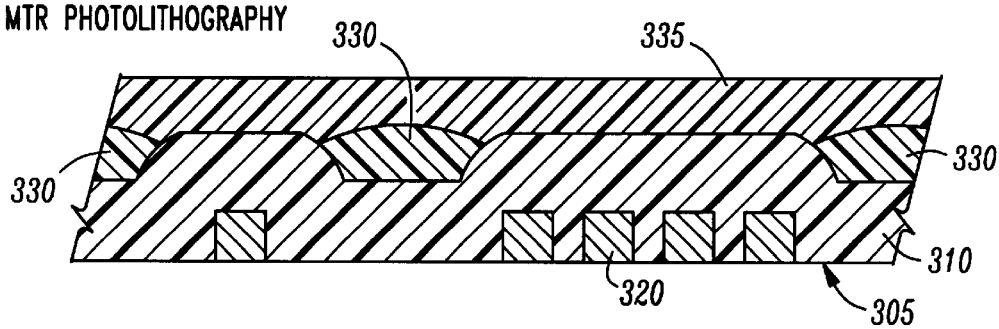
Figure 3C:
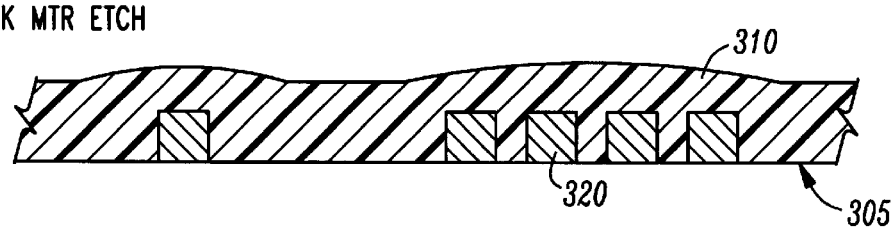
Figure 3D:
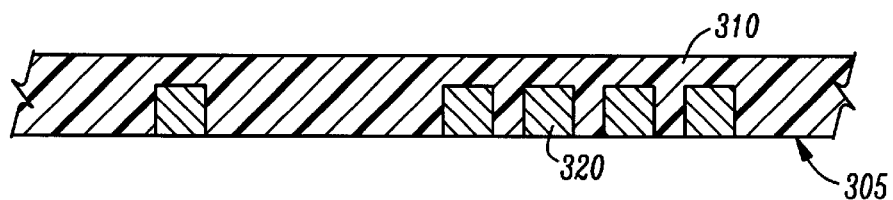

Turning now to FIGS. 3A–3D, illustrated are cross-sectional views of the procedural steps of an advantageous embodiment of the present invention that employs a Block MTR process followed by a CMP process on a semiconductor wafer surface 305. FIG. 3A schematically shows a plurality of conventional interconnect structures (one of which is designated as 320), over which a layer of dielectric material 310 has been deposited. As seen in FIG. 3A, the surface of the dielectric layer 310 dramatically reflects the topography of the underlying interconnect structures 320. In FIG. 3B, a block photoresist 330 is applied in the recessed areas on the semiconductor wafer 305 between the underlying interconnect structures 320 and photolithography is conducted on the block photoresist 330. An additional photoresist layer 335 is then applied over the entire surface of the semiconductor wafer 305. Next, in FIG. 3C, a resist etchback is performed to transfer the flattened surface of the additional photoresist 335 into the dielectric layer 310. This flattening is achieved by matching the photoresist and dielectric removal rates during the etching process. The etching is stopped once a substantial portion of the photoresist 335 is removed from the surface of the dielectric layer 310. Following the Block MTR process, a CMP process is performed to substantially remove any remaining topography in the dielectric surface 310. The result of this subsequent CMP process is illustrated in FIG. 3D, which shows an acceptable degree of planarization of the dielectric surface 310. Because the dielectric surface 310 is substantially planar as defined herein, it is expected that the irregularity in subsequent dielectric levels will likewise be reduced to acceptable levels.

Figure 4A:
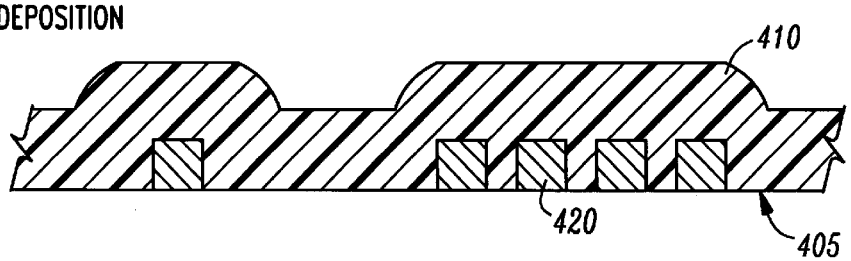
FIGS. 4A–4E illustrate cross-sectional views of procedural steps of an embodiment of the present invention, a Block MTR process followed by a Plug CMP process.
Figure 4B:
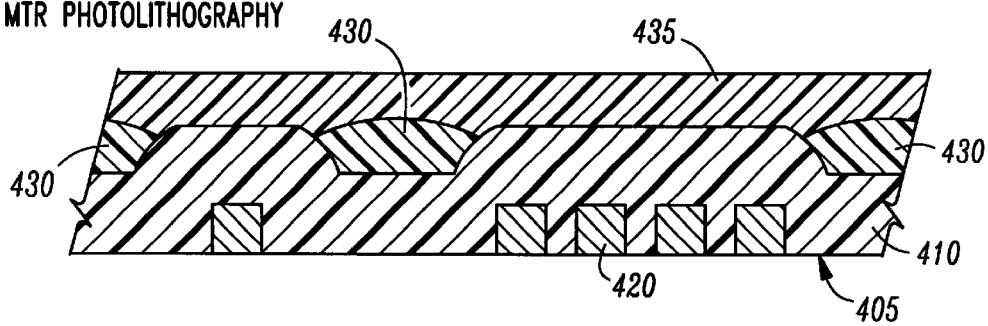
Figure 4C:
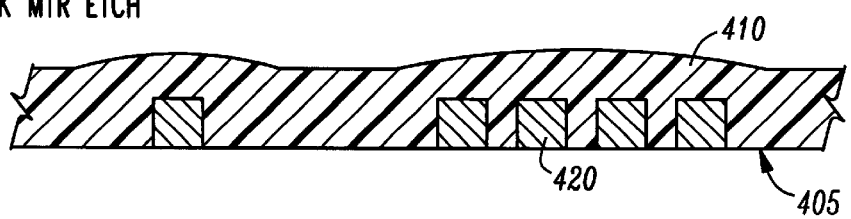
Figure 4D:
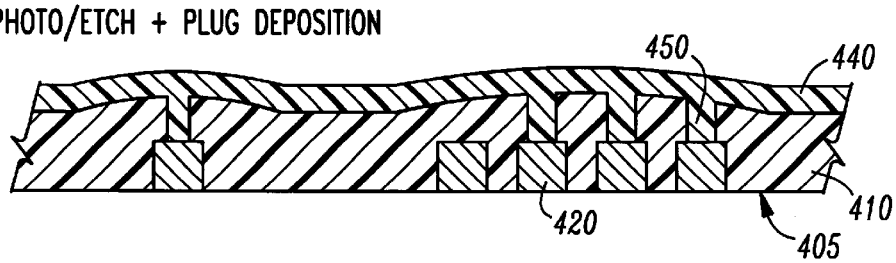
Figure 4E:
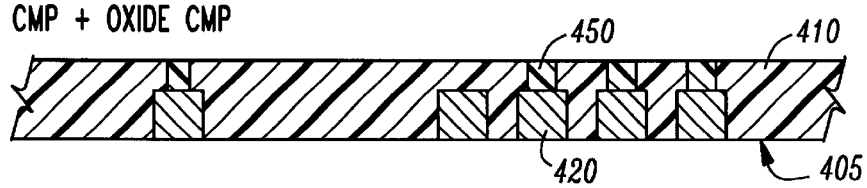

Turning now to FIGS. 4A–4E, illustrated are cross-sectional views of the procedural steps of another embodiment that employs, a Block MTR process followed by a Plug CMP process. FIG. 4A shows a plurality of interconnect structures (one of which is designated as 420), over which a layer of dielectric material 410 has been deposited. Again, the surface of the dielectric layer 410 dramatically reflects the topography of the underlying interconnect structures 420. In FIG. 4B, the first step involves the application of an additional photoresist 430 in areas on the semiconductor wafer 405 where the surface of the dielectric 410 forms recesses. This generally flattens the overall surface of the dielectric 410 but not to an acceptable degree of required planarization. Next, in FIG. 4C, a Block MTR etch is performed to further flatten the surface and remove effects of the interconnect structures 420. FIG. 4D shows how the present invention can be used in conjunction with a conventional metal plug deposition process. In such embodiments, openings (commonly referred to as "windows" or "vias") are first formed in the dielectric 410 followed by the deposition of a metal 440 prior to CMP. Using conventional deposition processes, the metal 440 is deposited into the openings and over the surface of the dielectric 410 to form metal-filled openings, called plugs (one of which designated as 450), that contact the embedded structures 420. In the MTR+CMP process previously described, the formation of the openings and the plugs 450 commonly are performed after an initial dielectric CMP. The plug formation process is generally followed by a CMP in order to remove the excess portions of the interconnect metal from the surface of the dielectric 410. A short, secondary dielectric CMP is performed after the "plug CMP" to remove any surface scratches that may have occurred. FIG. 4E shows the final result after the Block MTR is performed followed by a Plug CMP and an Oxide CMP. These two CMP processes completely remove the overlying metal layer 440 and partially remove the dielectric layer 410 and substantially planarizes the dielectric surface 410 to an acceptable degree, while still leaving the metal-filled openings 450, which are electrically connected to the underlying structures 420.

Figure 5A:
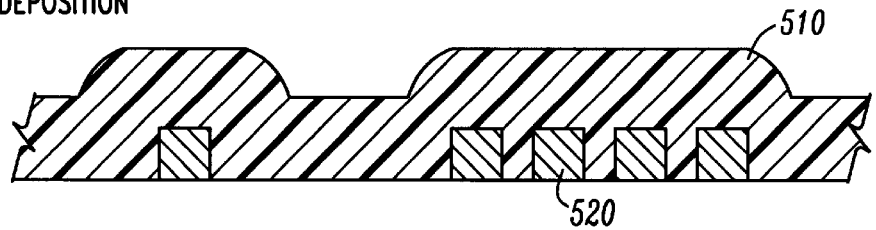
FIGS. 5A–5D illustrate cross-sectional views of procedural steps of an embodiment of the present invention, a Horn MTR process followed by a CMP process.
Figure 5B:
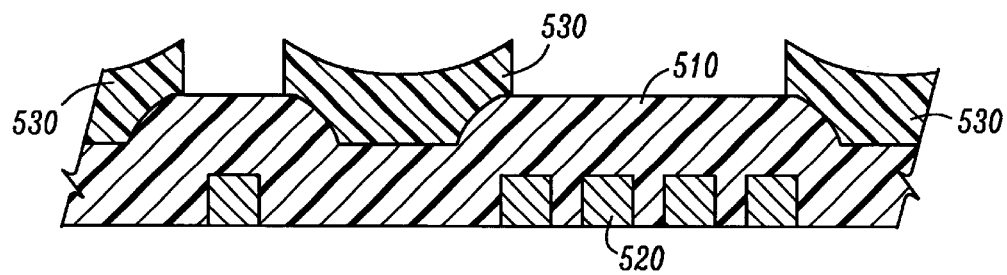
Figure 5C:
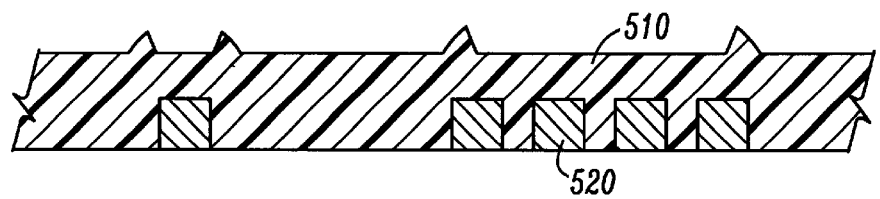
Figure 5D:
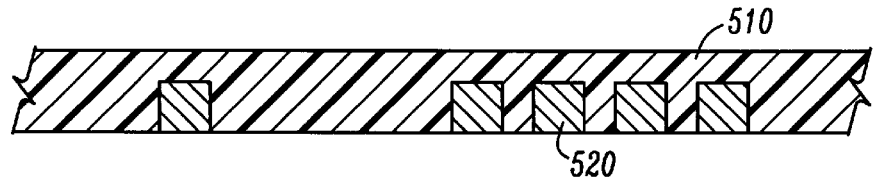

Turning now to FIGS. 5A–5D, illustrated are cross-sectional views the procedural steps of yet another advantageous embodiment of the present invention that uniquely employs a Horn MTR process followed by a CMP process. FIG. 5A shows a plurality of interconnect structures (one of which is designated as 520), over which a layer of dielectric material 510 has been deposed. The surface of the dielectric layer 510 dramatically reflects the topography of the underlying interconnect structures. In FIG. 5B, a photoresist layer 530 is applied and then partially removed by way of photolithography to produce openings 525 in the photoresist layer 530 over the interconnect structures 520. Next, in FIG. 5C, the exposed dielectric is etched away to further flatten the surface of the dielectric layer 510 by reducing the height of the exposed areas of the dielectric layer 510. Commonly, a conventional anisotropic etch is employed, but other etching techniques may be employed with equal success. The Horn etch forms small ridges 540 near the edges of the underlying interconnect structures 520 that resemble horns. These small horns 540 are easily removed using a CMP process. FIG. 5D shows the final result after the Block MTR is performed and followed by a CMP. The CMP substantially planarizes the dielectric surface 510 to an acceptable degree.

In testing the new processes, data conclusively showed the advantageous results received from the novel processes. Data from a prior art CMP was compared to the data received from the Block MTR+CMP, the BMTR+Plug CMP and the Horn MTR+CMP. Those data comparisons illustrated that while the final cumulative target values are the same between the prior art and the embodiments of the present invention, the variations in the dielectric thickness of the new processes show dramatic differences over those exhibited by the prior art processes. For example, with a target dielectric thickness of 8475 Å, the cumulative variation of the prior art was 3625 Å. In contrast, however, the variations in the three illustrated embodiments covered by the present invention ranged only from 2000 Å to 2150 Å, which is a significant improvement in the dielectric thickness variation produced by prior art processes. Therefore, the greater efficiency of the embodiments of the present invention is clearly shown in the form of an acceptable variation that is approximately half that of the prior art.

From the foregoing it can be seen that the present invention provides a method of planarizing an irregular surface of a semiconductor wafer. In advantageous embodiments, the method comprises applying a photoresist material over recessed areas and protruding areas of the irregular surface, etching the photoresist, etching partially into protruding areas of the irregular surface to remove a portion of the irregular surface, and polishing the irregular surface to a substantially planar surface, which in some embodiments, may include chemically and mechanically polishing the irregular surface.

Although the present invention has been described in detail, those skilled in the art should understand that they can make various changes, substitutions and alterations herein without departing from the spirit and scope of the invention in its broadest form.

What is claimed is:

1. A method of planarizing an irregular surface of a semiconductor wafer, comprising:

applying a photoresist material over a recessed area and protruding areas of said irregular surface;

forming openings in said photoresist to produce exposed portions of said protruding areas;

removing said photoresist and removing a portion of said exposed portions to produce remnants of said protruding areas; and polishing said irregular surface and said remnants to a substantially planar surface.

2. The method as recited in claim 1 wherein polishing includes chemically and mechanically polishing said irregular surface and said remnants.

3. The method as recited in claim 1 wherein applying includes applying said photoresist over a dielectric material having an irregular surface.

4. The method as recited in claim 1 further including forming openings in said irregular surface and forming interconnect material within said opening prior to polishing.

5. The method as recited in claim 1 further comprising applying a dielectric over active or passive devices of an integrated circuit to form said irregular surface.

6. A method of planarizing an irregular surface over a device of an integrated circuit, comprising:

applying a dielectric material over said device to form an irregular surface having a recessed area and protruding areas;

applying a photoresist in said recessed area;

applying an additional photoresist material over said photoresist and said protruding areas of said irregular surface;

using an etchant to remove said photoresist and said additional photoresist and to remove a portion of said protruding areas, said photoresist and protruding areas having substantially the same etch rate; and polishing said irregular surface to a substantially planar surface.

7. The method as recited in claim 6 wherein polishing includes chemically and mechanically polishing said irregular surface.

8. The method as recited in claim 6 further including forming openings in said irregular surface and forming interconnect material within said opening prior to polishing.

9. A method of planarizing an irregular surface over a device of an integrated circuit, comprising:

applying a dielectric material over said device to form an irregular surface having a recessed area and protruding areas;

applying a photoresist over said recessed area and said protruding areas;

forming openings in said photoresist to produce exposed portions of said protruding areas;

removing said photoresist and removing a portion of said exposed portions to produce remnants of said protruding areas; and polishing said irregular surface and said remnants to a substantially planar surface.

10. The method as recited in claim 9 wherein polishing includes chemically and mechanically polishing said irregular surface and said remnants.

11. The method as recited in claim 9 further including forming openings in said irregular surface and forming interconnect material within said opening prior to polishing.

12. The method as recited in claim 9 wherein applying said dielectric material includes applying silicon dioxide.

\* \* \* \* \*